（12）United States Patent
Hsu et al.

(10) Patent No.: US 6,975,545 B2
(45) Date of Patent: Dec. 13, 2005

(54) NON-VOLATILE MEMORY CELL

(75) Inventors: Ching-Hsiang Hsu, Hsin-Chu (TW);
Shih-Jye Shen, Hsin-Chu (TW);
Hsin-Ming Chen, Tainan Hsien (TW);
Hai-Ming Lee, Taipei (TW)

(73) Assignee: eMemory Technology Inc., Hsin-Chu (TW)

( * ) Notice: Subject to any disclaimer, the term of this patent is extended or adjusted under 35 U.S.C. 154(b) by 0 days.

(21) Appl. No.: 10/707,700

(22) Filed: Jan. 5, 2004

(65) Prior Publication Data
US 2005/0098817 A1 May 12, 2005

(30) Foreign Application Priority Data
Nov. 6, 2003  (TW) .......................... 92131056 A

(51) Int. Cl.[7] .............................................. G11C 16/04
(52) U.S. Cl. ............................. 365/185.28; 365/185.26
(58) Field of Search ....................... 365/185.28, 185.29, 365/185.25, 185.26

(56) References Cited

U.S. PATENT DOCUMENTS 6,750,102 B1    6/2004  Lancaster
6,831,863 B2 *  12/2004 Yi et al. ................ 365/185.29
6,838,345 B2 *  1/2005  Chang ......................... 438/261
6,861,701 B2    3/2005  Williams et al.
6,870,765 B2    3/2005  Fujiwara
2003/0227049 A1 12/2003 Sakakibere
2004/0005764 A1 1/2004  Wu et al.

* cited by examiner

Primary Examiner—Thong Q. Le
(74) Attorney, Agent, or Firm—Winston Hsu

(57) ABSTRACT

A memory cell includes an N-type well, three P-type doped regions, a first stacked dielectric layer, a first gate, a second stacked dielectric layer, and a second gate. The three P-type doped regions are formed on the N-well. The first dielectric stack layer is formed on the N-type well and between the first doped region and the second doped region from among the three P-type doped regions. The first gate is formed on the first stacked dielectric layer. The second stacked dielectric layer is formed on the N-type well and between the second doped region and the third doped region from among the three P-type doped regions. The second gate is formed on the second stacked dielectric layer.

4 Claims, 7 Drawing Sheets

NON-VOLATILE MEMORY CELL

BACKGROUND OF INVENTION

1. Field of the Invention

The present invention relates to a non-volatile memory cell, and more specifically, to a non-volatile memory cell having two transistors and a method for operating it.

2. Description of the Prior Art

Non-volatile memory stores data even without a power supply so that it is widely used in various portable electronic products such as personal digital assistants (PDA), mobile phones, and memory cards. In order to respond to these requirements, non-volatile memory technology aims for compatibility with CMOS processing, low power consumption, high writing efficiency, low cost and high density. However, as non-volatile memories become smaller in size, their gate oxide layers become accordingly thinner so that stored data vanishes easily, which causes a problem in the data storing ability of non-volatile memory.

Please refer to FIG. 1 showing a conventional memory cell 10. The memory cell 10 includes an NMOS transistor 28 and a PMOS transistor 30 separated by an insulating field oxide layer 24. The NMOS transistor 28 is formed on a P-type substrate 12 and includes a first floating gate 32, an $N^+$ source doped region 14, and an $N^+$ drain doped region 16. The PMOS transistor 30 is formed on an N-type substrate 18 and includes a second floating gate 34, a $P^+$ source doped region 20, and a $P^+$ drain doped region 22. The PMOS transistor 30 is planted with a heavily doped N-type channel stop region 38 under the second floating gate 34, adjacent to the $P^+$ source doped region 20. The first floating gate 32 and the second floating gate 34 are connected with a floating gate conductive line 36 so that both are kept at the same level. When writing data into the memory cell 10, the first floating gate 32 generates a corresponding level according to a control gate voltage. At this time the second floating gate 34 has the same level as the first floating gate 32 because of the connection by the floating gate conductive line 36; the level accelerates electrons in a depletion region between the $P^+$ source doped region 20 and the N-type channel stop region 38 and makes them injecting into the second floating gate 34.

However, the conventional memory cell 10 has disadvantages as follows. First, the conventional memory cell 10 is composed of the PMOS transistor 30 and the NMOS transistor 28 so that it occupies a larger chip area. Second, the conventional memory cell 10 requires the floating gate conductive line 36 to connect the first floating gate 32 and the second floating gate 34. Moreover, the field oxide layer 24 is required to separate the PMOS transistor 30 from the NMOS transistor 28. Therefore, the conventional memory cell 10 occupies too large chip area and is structurally complicated, all of which increase the cost and difficulties in the manufacturing process.

SUMMARY OF INVENTION

It is therefore a primary objective of the present invention to provide a memory cell and a method for writing data there into in order to solve the problems mentioned above.

Briefly summarized, a method for writing a memory cell includes providing a memory cell which includes an N-type well, three P-type doped regions formed on the N-type well, a first stacked dielectric layer formed on the N-type well and between a first doped region and a second doped region from among the three P-type doped regions, a first gate formed on the first stacked dielectric layer, a second stacked dielectric layer formed on the N-type well and between the second doped region and a third doped region from among the three P-type doped regions, and a second gate formed on the second stacked dielectric layer; applying a common voltage to the N-type well, the third doped region, and the second gate; applying a voltage less than the common voltage to the first gate in order to erase charges stored in the first stacked dielectric layer; applying a first voltage to the first gate and a second voltage larger than the first voltage to the second gate in order to conduct respectively P-type channels between the first doped region and the second doped region, and the second doped region and the third doped region; applying a voltage larger than the second voltage to the N-type well and the first doped region; and applying a voltage less than the second voltage to the third doped region in order to inject channelhot holeinduced hot electrons in the P-type channel between the second doped region and the third doped region.

The present invention further provides a memory cell including an N-well, three P-type doped regions formed on the N-type well, a first stacked dielectric layer formed on the N-type well and between a first doped region and a second doped region from among the three P-type doped regions, a first gate formed on the first stacked dielectric layer, a second stacked dielectric layer formed on the N-type well and between the second doped region and a third doped region from among the three P-type doped regions, and a second gate formed on the second stacked dielectric layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
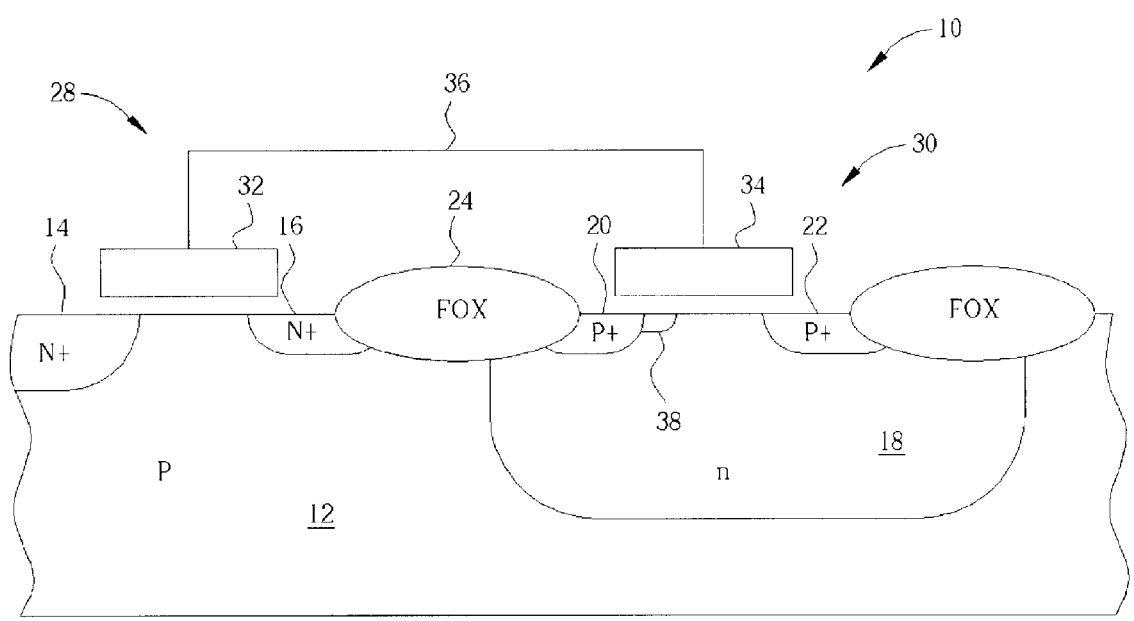
FIG. 1 illustrates a conventional memory cell.
Figure 2:
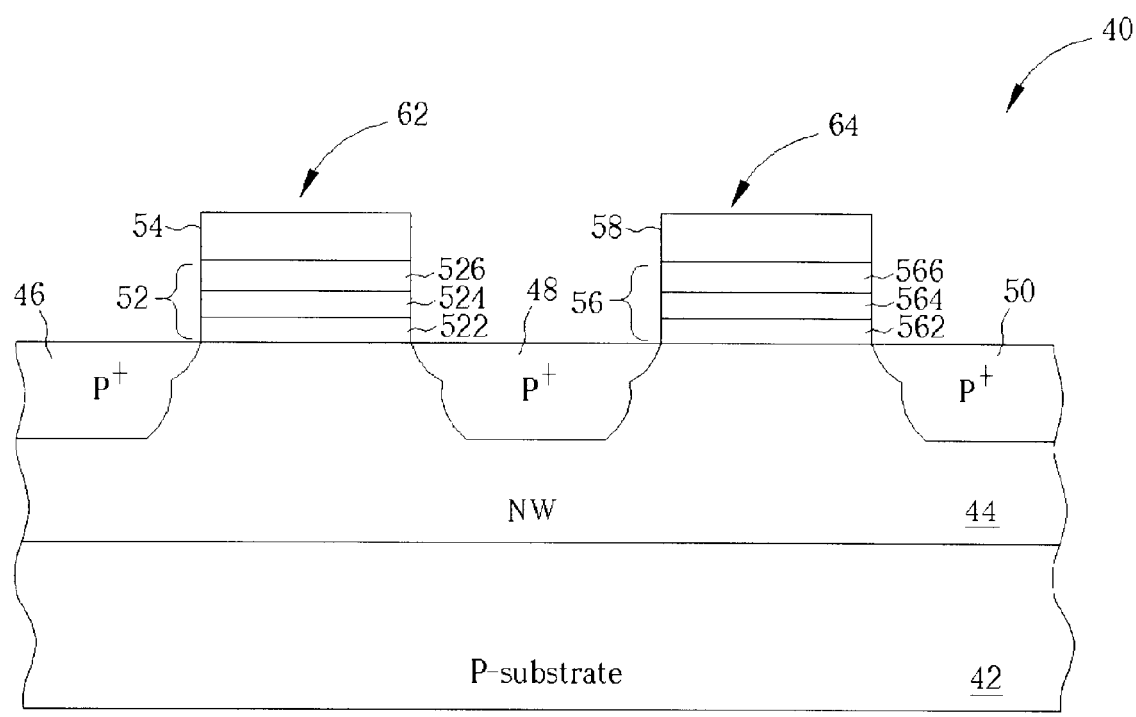
FIG. 2 illustrates a memory cell according to the present invention.
Figure 3:
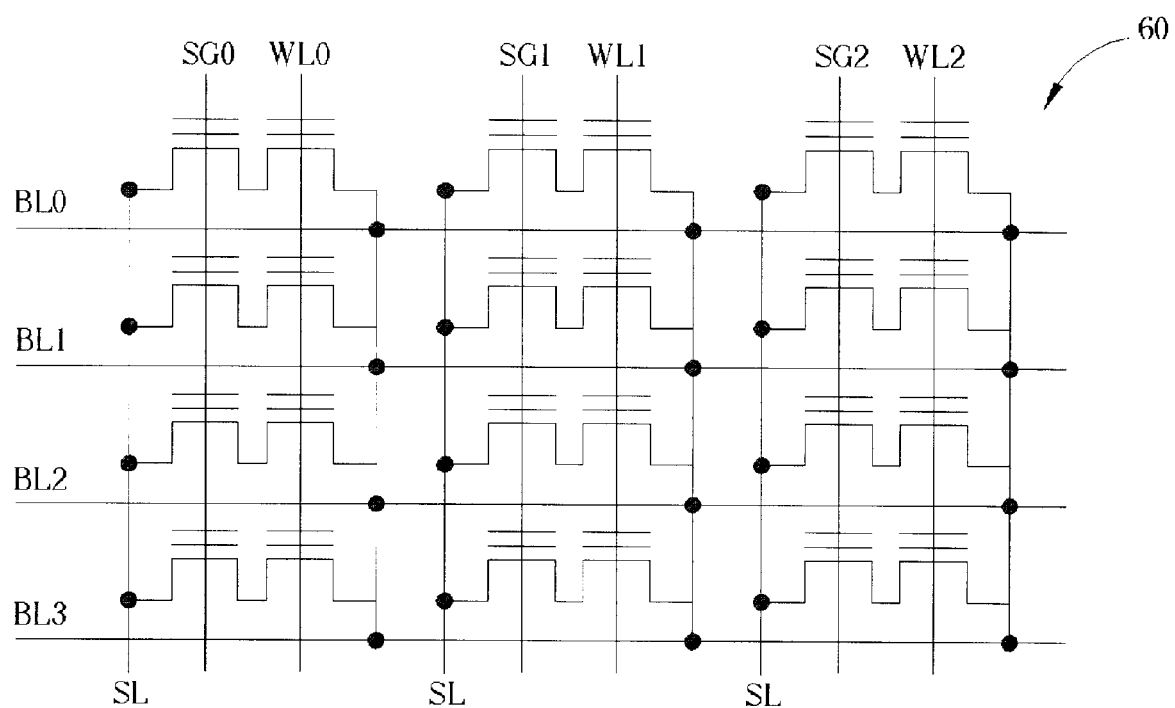
FIG. 3 illustrates a memory module composed of the memory cells shown in FIG. 2.

Please refer to FIG. 2 showing a memory cell 40 according to the present invention, and FIG. 3 showing a memory module 60 composed of the memory cells 40 shown in FIG. 2. The memory cell 40 includes a P-type substrate 42, an N-type well 44, three P-type doped regions 46, 48, 50, a first stacked dielectric layer 52, a first gate 54, a second stacked dielectric layer 56, and a second gate 58. The N-type well 44 is formed on the P-type substrate 42, the three P-type doped regions 46, 48, 50 are formed on the N-type well 44, the first stacked dielectric layer 52 is formed on the N-type well 44 and between the first doped region 46 and the second doped region 48 from among the three doped regions, the first gate 54 is formed on the first stacked dielectric layer 52, the second stacked dielectric layer 56 is formed on the N-type well 44 and between the second doped region 48 and the third doped region 50 from among the three doped regions, and the second gate 58 is formed on the second stacked dielectric layer 56.

The first gate 54 and the second gate 58 can be polysilicon layers, policide layers, or metal layers. Both the first stacked dielectric layer 52 and the second stacked dielectric layer 56 include respectively first silicon dioxide layers 522, 562; charge storage layers 524, 564; and second silicon dioxide layers 526, 566, wherein the charge storage layers 524, 564 can be composed of either silicon nitride ($Si_3N_4$) or silicon oxynitride ($Si_xN_yO_z$). The first gate 54, the first stacked dielectric layer 52, the first doped region 46, and the second doped region 48 form a select transistor 62 for turning on and off the memory cell 40. The second gate 58, the second stacked dielectric layer 56, the second doped region 48, and the third doped region 50 form a storage transistor 64 for providing the memory cell 40 to store data. In practice, the memory cells 40 are aligned to create the memory module 60. As shown in FIG. 3, the memory module 60 is composed of a plurality of memory cells 40. These memory cells 40 are aligned in the form of an NOR-array, wherein the first gates 54 of the memory cells on the same column are connected to the same select gate lines (SG0, SG1, SG2), the second gates 58 of the memory cells on the same column are connected to the same word lines (WL0, WL1, WL2), the third doped regions 50 of the memory cells on the same row are connected to the same bit lines (BL0, BL1, BL2), and the first doped regions 46 of all the memory cells are connected to the same source line (SL).

Figure 4:
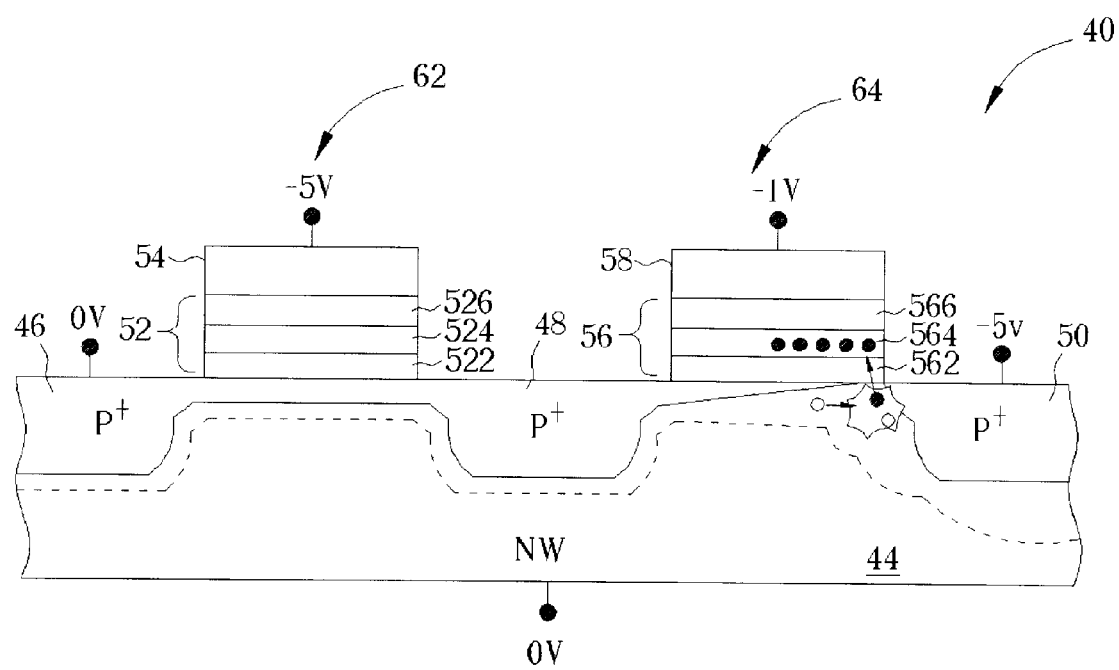
FIG. 4 illustrates the writing operation of the memory cell.

Please refer to FIG. 4 showing the writing operation of the memory cell 40. The writing operation of the memory cell 40 is to inject electrons into the charge storage layer 564 of the storage transistor 64 by channel-hot-hole-induced-hot-electron injection. Before writing data into the memory cell 40, turn on the select transistor 62 of the memory cell 40; that is to apply 0V to the N-type well 44 and −5V to the first gate 54 so that a P-type channel between the first doped region 46 and the second doped region 48 is conducted. When writing data into the memory cell 40, apply 1V to the second gate 58, 0V to the first doped region 46, and −5V to the third doped region 50. Since the P-type channel between the first doped region 46 and the second doped region 48 is conducted and the first doped region 46 and the second doped region 48 have the same level, the operation of the storage transistor 64 is in a saturation region, meaning that holes in a P-type channel between the second doped region 48 and the third doped region 50 are likely to be accelerated by an electric field to obtain a high energy and collide with the N-type well 44 to generate electron-hole pairs. The electrons generated after collision are attracted by the voltage applied to the second gate 58 and injected into the charge storage layer 564 of the storage transistor 64.

Figure 5:
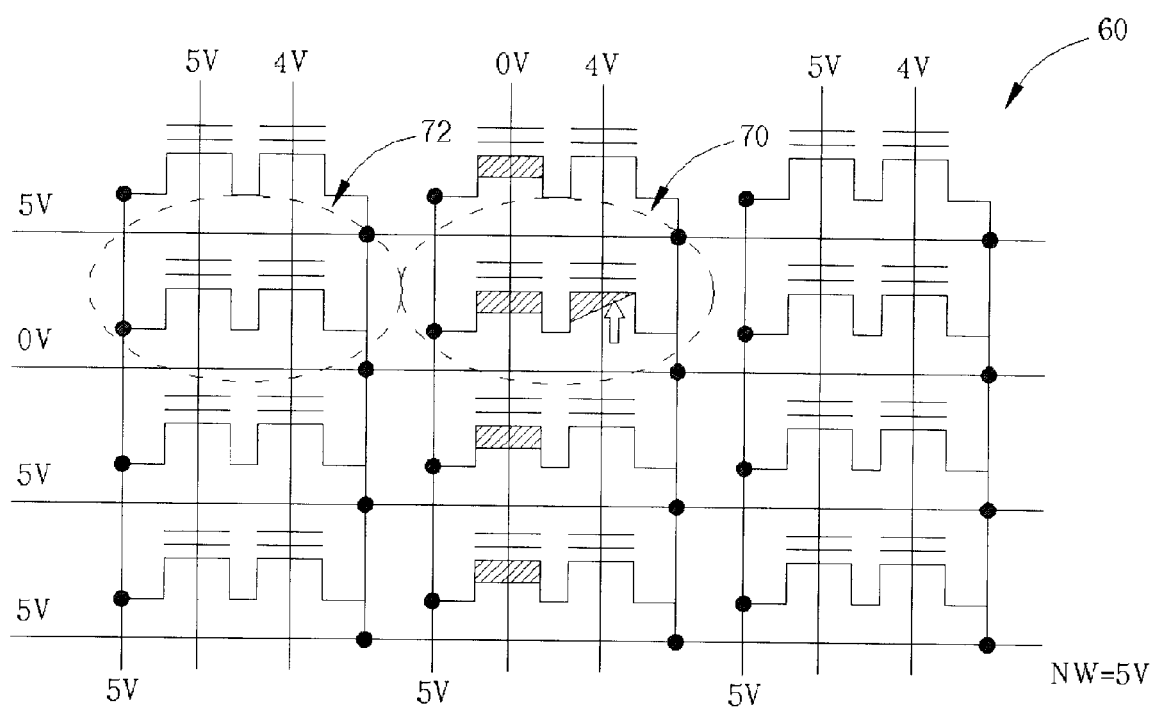
FIG. 5 illustrates the writing operation of the memory module.

Please refer to FIG. 5 showing the writing operation of the memory module 60. The writing operation of the memory module 60 is similar to that of the memory cell 40; that is to apply the voltages to the first gate 54, the second gate 58, the first doped region 46, and the third doped region 50 of the memory cell 40 correspondingly to the select gate lines (SG0, SG1, SG2), the word lines (WL0, WL1, WL2), the source line (SL) and the bit lines (BL0, BL1, BL2). In FIG. 5, all the operation voltages in FIG. 4 are shifted by 5V in order to achieve positive voltage operation. When writing data into the memory module 60, first select a memory cell to be written 70, then apply 5V to the N-type well, 0V to the select gate line (SG1) connected to the memory cell to be written 70, 5V to the select gate lines (SG0, SG2) not connected to the memory cell to be written 70, 4V to all the word line (WL0, WL1, WL2), 5V to the source line (SL), 0V to the bit line (BL1) connected to the memory cell to be written 70, and 5V to the bit lines (BL0, BL2, BL3) not connected to the memory cell to be written 70. When writing data into the memory module 60, the P-type channels of the storage memories 64 of all the memory cells are conducted. Although the select transistors 62 of the memory cells on the same column with the memory cell to be written 70 are also turned on, there is no write interference to the storage memories of these memory cells, since the word lines and the bit lines are applied with the same voltage. However, the memory cells on the same row with the memory cell to be written 70 are applied with 5V select gate line voltage, 4V word line voltage and 0V bit line voltage so that band-to-band tunneling effect may occur. But at this time the 4V word line voltage conducts the storage transistor of the memory cell 72, and the 5V select gate line voltage turns off the select transistor of the memory cell 72 so that band-to-band tunneling effect occurs on the select transistor of the memory cell 72, meaning that electrons are injected into the charge storage layer of the select transistor by band-to-band tunneling. Therefore, write interference to the storage transistor of the memory cell can be prevented by the select transistor of the memory cell 72.

Figure 6:
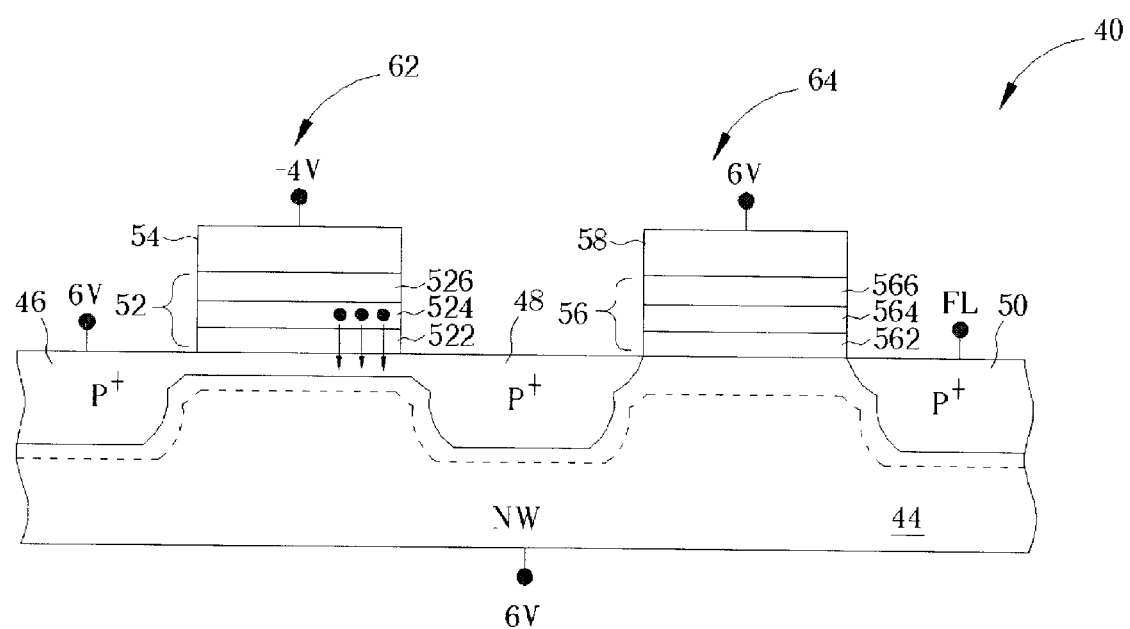
FIG. 6 illustrates the reset operation of the memory cell.
Figure 7:
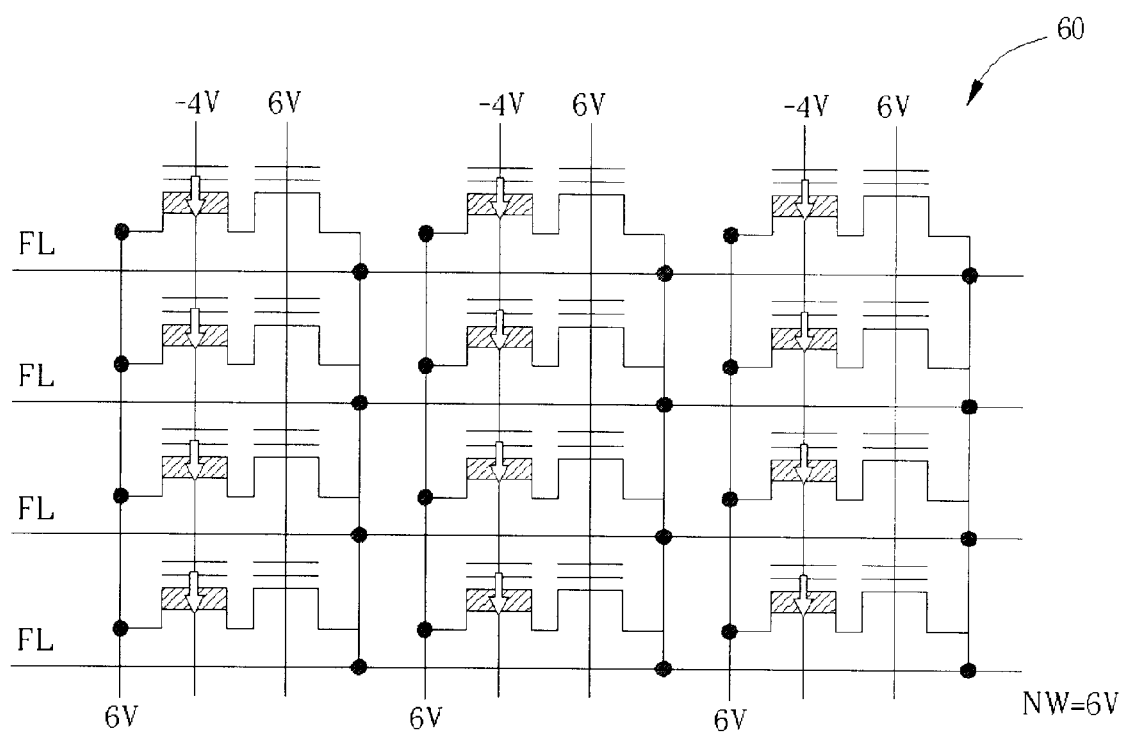
FIG. 7 illustrates the reset operation of the memory module.

Please refer to FIG. 6 showing reset operation of the memory cell 40, and FIG. 7 showing reset operation of the memory module 60, both of which are according to the present invention. The memory module 60 may cause write interference to the memory cells 72 on the same row with the memory cell to be written 70 when writing, but since the select transistor of the memory cell 72 instead of the storage transistor of the memory cell 72 receives write interference, the accuracy of data storage is not influenced. Whenever there are electrons injected into the select transistor of the memory cell 72, the threshold voltage of the select transistor to generate the P-type channel is changed. Therefore, the present invention provides a method for resetting the memory cell 40 and the memory module 60, which is to erase electrons injected into the select transistor due to write interference. As shown in FIG. 6, the memory cell 40 operates a reset operation by Fowler-Nordheim (FN) tunneling; that is to apply 6V to the N-type well 44, the first doped region 46 and the second gate 58, and −4V to the first gate 54 so that the first stacked dielectric layer 52 of the select transistor 62 has a cross voltage of 10V, in order to erase the electrons limited within the charge storage layer 524 of the first stacked dielectric layer 52. The third doped region 50 just needs to be floated during the reset operation. The reset operation of the memory module 60 is similar to that of the memory cell 40; that is to apply the voltages applied to the first gate 54, the second gate 58, the first doped region 46, the N-type well 44 and the third doped region 50 of the memory cell 40 correspondingly to the select gate lines, the word lines, the source line, the N-type well and the bit lines, as shown in FIG. 7.

In contrast to the prior art, the memory cell according to the present invention includes the storage transistor serially connected to the select transistor, and both of which are PMOS transistors. Therefore the memory cell is structurally simple, occupies less chip area, and can be manufactured by a general CMOS process. In the memory cell, data is stored in the storage transistor having the stacked dielectric layer by injecting electrons into the charge storage layer of the storage transistor by channel-hot-hole-induced-hot-electron injection. And after the memory cells are arranged for the memory module, the select transistors of the memory cells can protect the storage transistors from write interference between the memory cells. Moreover, the select transistor of the memory cell also has the stacked dielectric layer. When the memory cell receives write interference, the electrons are injected into the stacked dielectric layer of the select transistor to change the threshold voltage of the select transistor. Therefore the present invention further provides a method for writing data into the memory cell and a method for resetting the select transistor of the memory cell and erasing the electrons stored in the select transistor before writing data into the memory cell.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for writing a memory cell comprising:
   providing a memory cell comprising an N-type well, three P-type doped regions formed on the N-type well, a first stacked dielectric layer formed on the N-type well and between a first doped region and a second doped region from among the three P-type doped regions, a first gate formed on the first stacked dielectric layer, a second stacked dielectric layer formed on the N-type well and between a second doped region and a third doped region from among the three P-type doped regions, a second gate formed on the second stacked dielectric layer;
   applying a common voltage to the N-type well, the first doped region and the second gate;
   applying a voltage less than the common voltage to the first gate in order to erase charges stored in the first stacked dielectric layer;
   applying a first voltage to the first gate and a second voltage larger than the first voltage to the second gate, in order to conduct respectively P-type channels between the first doped region and the second doped region and the second doped region and the third doped region;
   applying a voltage larger than the second voltage to the N-type well and the first doped region; and
   applying a voltage less than the second voltage to the third doped region in order to inject channel hot hole induced hot electrons into the second stacked dielectric layer formed on the N-type well and between the second doped region and the third doped region.

2. The method of claim 1 wherein each stacked dielectric layer comprises:
   a first silicon dioxide layer formed on the N-type well;
   a charge storage layer formed on the first silicon dioxide layer; and
   a second silicon dioxide layer formed on the charge storage layer.

3. The method of claim 2 wherein charge storage layer is composed of silicon nitride ($Si_3N_4$).

4. The method of claim 2 wherein charge storage layer is composed of silicon oxynitride ($Si_xN_yO_z$).

* * * * *